United States Patent [19] — Takahashi et al. — [11] 4,156,819 — [45] May 29, 1979

United States Patent [19]

Takahashi et al.

[11] 4,156,819

[45] May 29, 1979

[54] MASTER-SLAVE FLIP-FLOP CIRCUIT

[75] Inventors: Toru Takahashi; Kodo Kimura, both of Tokyo, Japan

[73] Assignee: Nippon Electric Co., Ltd., Tokyo, Japan

[21] Appl. No.: 851,753

[22] Filed: Nov. 15, 1977

[30] Foreign Application Priority Data

Nov. 19, 1976 [JP] Japan ............................... 51/138389

[51] Int. Cl.[2] ..................... H03K 3/286; H03K 17/00; H03K 21/32; G01R 15/12

[52] U.S. Cl. ................................ 307/272; 307/247 R; 307/289; 324/73 R; 328/48; 328/195; 328/196; 365/201

[58] Field of Search ....................... 307/272, 289, 291; 324/73 R, 73 PC; 328/48, 191, 196, 200, 206; 365/201

[56] References Cited

U.S. PATENT DOCUMENTS

| | | | |
|---|---|---|---|
| 3,336,579 | 8/1967 | Heymann | 365/201 X |
| 3,440,449 | 4/1969 | Priel et al. | 307/289 X |
| 3,454,935 | 7/1969 | Hippisley, Jr. | 307/272 |
| 3,609,569 | 9/1971 | Todd | 307/272 X |
| 3,617,776 | 11/1971 | Priel | 307/289 X |
| 3,673,397 | 6/1972 | Schaefer | 324/73 R X |
| 3,728,561 | 4/1973 | Brocker, Jr. | 307/291 |
| 3,814,953 | 6/1974 | Malaviya | 307/289 |
| 3,873,818 | 3/1975 | Barnard | 324/73 R X |
| 3,878,405 | 4/1975 | Sylvan | 324/73 R X |
| 3,917,961 | 11/1975 | Reed | 328/206 X |

*Primary Examiner*—Larry N. Anagnos

*Attorney, Agent, or Firm*—John M. Calimafde

[57] ABSTRACT

A logic circuit, which includes master-slave flip-flops, advantageously designed to place both the master and the slave flip-flops in a predetermined logic state so that the logic circuit can be tested in one clock cycle in the same manner as a combinational logic circuit is tested.

6 Claims, 3 Drawing Figures

MASTER-SLAVE FLIP-FLOP CIRCUIT

FIELD OF THE INVENTION

This invention relates to a logic circuit which includes master-slave flip-flop circuits, and more particularly to a semiconductor integrated circuit having a test circuit to faclitate checking a logic circuit which includes master-slave flip-flop circuits.

DESCRIPTION OF THE PRIOR ART

As is well known, the master-slave flip-flop circuit (hereinafter referred to as MS-FF) essentially consists of two series-connected flip-flops, respectively called a master flip-flop (hereinafter as M-FF) and a slave flip-flop (hereinafter to as S-FF). The M-FF and the S-FF are controlled by clock signals of opposite phases. More particularly, the M-FF is supplied with and controlled by a first clock signal having a first state and a second state, while the S-FF is supplied with and controlled by a second clock signal having the second state and the first state in a complementary relationship with the first clock signal. Both the M-FF and S-FF are responsive to a "gate" condition which in response to the first state of the clock signals, allows input information to be written in the flip-flop. The M-FF and S-FF are also responsive to a "hold" condition which, in response to the second state of the clock signals, stores information without change in the flip-flop. Either the M-FF or S-FF is always in a "gate" condition, while a other is always in the "hold" condition, so that both of the flip-flops are never in the same condition. In other words, when either one of the master or slave flip-flops is in the "gate" condition in response to the first state, (e.g. logic "1" level), of one clock signal applied thereto, the other of the flip-flops is in the "hold" condition in response to the second state, (e.g. logic "0" level), of the other clock signal applied thereto. Accordingly, an instantaneous output cannot be produced from the MS-FF with any one state change ("1" or "0" level) of the clock signal, but an output can only be produced after one cycle of the clock signal. Therefore, in a logic circuit including MS-FFs between an input side and an output side thereof, it is impossible to transfer input information to the output side in a short period of time. In other words, the period of one cycle of the clock signal, i.e., a chain of two successive logic signals, consisting of a logical "1" and a logical "0" is required for transferring input information to an output via a MS-FF. In many circuits, a combinational circuit having a plurality of input terminals is coupled to the input side of a circuit which includes MS-FF's. Such a combinational circuit receives input signals of various combinations and generates outputs in response to the respective combinations. When the function or operation of this combinational circuit is to be checked or tested, input signals of predetermined combinations are supplied to its input terminals and its outputs are observed. However, since these outputs are derrived only via a circuit which includes MS-FFs, the time required for test inevitably includes the operation time of the MS-FFs included in the circuit.

From the foregoing it can be seen that two successive logic signals are required to obtain a single output from a combinational circuit which includes MS-FFs rather than the single logic signal necessary to obtain an output from a combinational circuit which does not include MS-FFs. This requirement results in added complexity in testing combinational circuits which include MS-FFs and also causes difficulty in locating trouble sources in the circuit. It can also be appreciated that when the circuits to be tested become larger in scale, and hence contain many MS-FFs the checking and testing of the logical function of the circuit becomes additionally. It is therefore an object of the instant invention to provide apparatus for testing a logic circuit, including MS-FFs, which does not have the disadvantages inherent in prior art testing circuits.

SUMMARY OF THE INVENTION

A logic circuit according to this invention comprises a plurality of master-slave flip-fllops, in which the master flip-flops and the slave flip-flops are connected in series and respectively controlled by mutually complementary clock signals impressed thereon.

It is a feature of the invention that testing means, for generating a test signal, is applied to both the master flip-flop and the slave flip-flops to force them into the gate condition at the same time. The test signal is advantageously fed to predetermined locations in the master flip-flops and slave flip-flops which receive the respective mutually complementary clock signals.

It is a further feature of the invention that the resultant logic circuit is especially suited for use in a semiconductor integrated circuit.

It is another feature of the invention that the testing means applies voltage of a common polarity to the predetermined locations so that the master flip-flops and slave flip-flops may be brought into the "gate" condition at the same time, thereby producing "data through" conditions between inputs and outputs in the circuit including the master-slave flip-flops. Therefore, a logic circuit, which includes a plurality of MS-FFs can be tested in a short time with ease and accuracy since all the MS-FFs are brought into the data through condition at the same time.

The foregoing and other objects and features of this invention will be more fully understood from the following description of an illustrative embodiment thereof taken in conjunction with the accompanying drawings.

DETAILED DESCRIPTION

Figure 1:
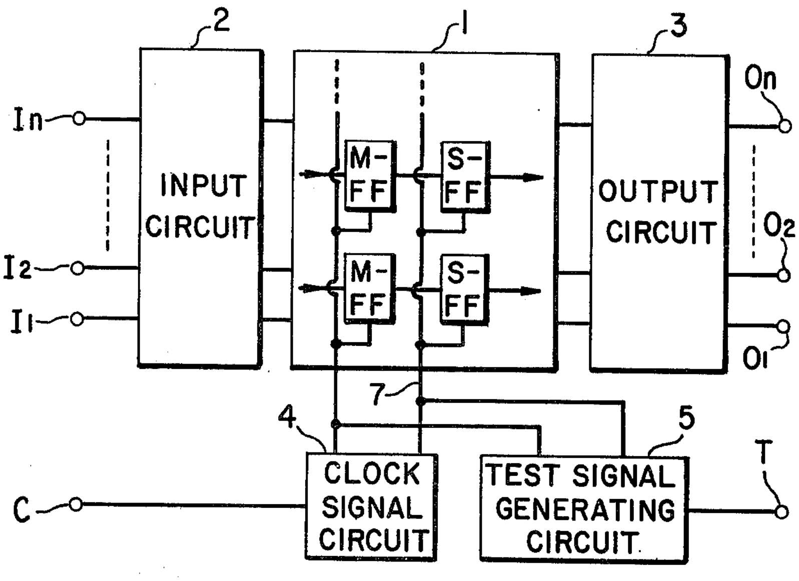
FIG. 1 is a block diagram showing an outline of the circuit according to the present invention.

Refer to FIG. 1 wherein an embodiment according to the present invention will be described.

As shown in FIG. 1, a logic circuit, implemented as a semiconductor integrated circuit unit, comprises a circuit block 1 including an array of MS-FFs, an input circuit block 2 having a plurality of input terminals I through In, and connected to an input side of block 1, an output circuit block 3 having a plurality of output terminals $O_1$ through $O_n$, and connected to an output side of block 1, a clock signal, circuit 4 providing the circuit block with mutually complementary clock signals, and a test signal generating circuit 5. In circuit block 1, each of the MS-FFs consists of the M-FF and a S-FF connected in series.

Input terminals of M-FFs are supplied with the signals derived from the input circuit block 2. Outputs of the S-FFs are transferred to the input side of the the output circuit block 3. All the M-FFs are commonly supplied with the one of the complementary clock signals by way of line 6. All the S-FFs are commonly supplied with the other of the complementary clock signals by way of line 7. The clock signal circuit 4 receives a clock signal at an input terminal C to produce the complementary clock signal CL and $\overline{CL}$ which are fed to the M-FFs via line 6 and the S-FFs via line 7.

As mentioned previously, when the M-FF is in the "gate" condition, the S-FF is normally in the "hold" condition, and vice versa. The test signal generating circuit 5 produces a test signal which is fed to lines 6 and 7 and forces both the M-FFs and S-FFs into the "gate" condition, at the same time, irrespective of the levels of the complementary clock signals. The test signal from the test signal generating circuit 5 is controlled in response to the level of a test terminal T. In response to the test signal, all the MS-FFs in the circuit block 1 can be brought to a "data through" condition between the input and output sides thereof. The result of attaining a "data through" condition is that all of the blocks between the input terminals $I_1$, $I_2$ . . . $I_n$, and the output terminals $O_1$, $O_2$ . . . $O_n$ function substantially as one combined circuit, thereby reducing the number of successive signals (patterns) required for the test and thus permitting an easy fast circuit test.

Figure 2:
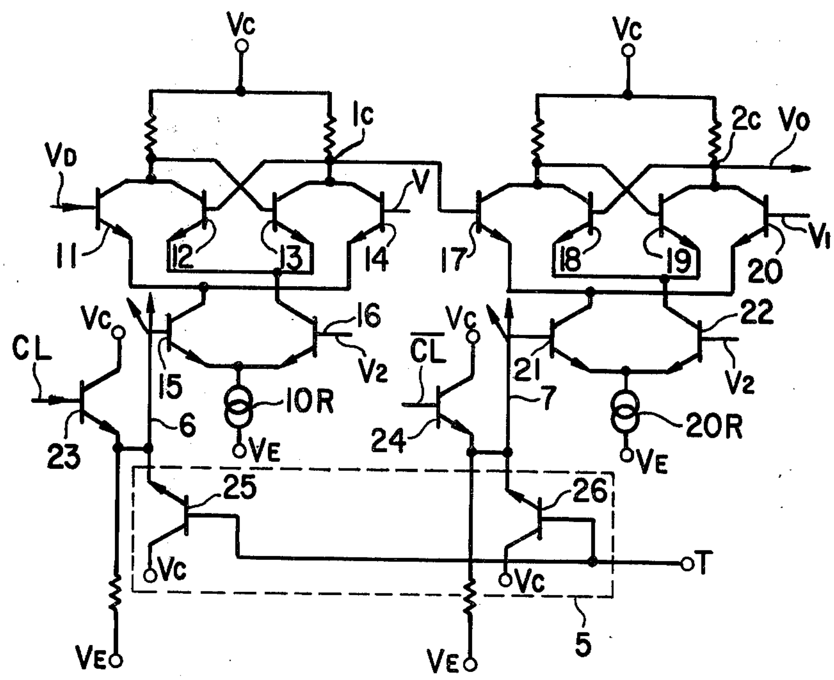
FIG. 2 is a circuit showing one embodiment of the present invention.

Refer now to FIG. 2, wherein an example of the circuit block 1 and the test signal generating circuit 5 will be described. The M-FF comprises npn transistors 11 to 16, in which the transistors 12 and 13 form a first flip-flop circuit for storing the input information and the transistors 11 and 14 form a first current switching circuit for reading the input information. The transistors 15 and 16 form a second current switching circuit which selectively operates one of the flip-flop circuits and the first current switching circuit in response to the clock signal CL supplied to a base of the transistor 15 by way of the line 6 and the emitter-follower transistor 23. The base electrode of the transistors 14 and 16 are supplied with reference voltages $V_1$ and $V_2$ respectively.

The S-FF comprises npn transistors 17 to 22, wherein the transistors 18 and 19 and the transistors 17 and 20 form a second flip-flop circuit and a third current switching circuit respectively. The transistors 21 and 22 form a fourth current switching circuit which selectively to operates one of the second flip-flop circuits and the third current switching circuit in response to the second clock signal $\overline{CL}$ supplied to a base of the transistor 21 by way of the line 7, and the emitter-follower transistor 24. In the M-FF, a voltage VD, comprising input information, is fed to the base of the transistor 11 and the output information is taken from node 1C and transferred to the input of the S-FF, i.e; the base of the transistor 17. The voltage Vo, comprising the output information of the S-FF, is taken from node 2C and is transferred to the output circuit block 3.

The test signal generating circuit 5 comprises npn transistors 25 and 26, collectors of which are supplied with a positive voltage Vc. The bases of transistors 25 and 26 are both connected to terminal T. The emitters of the transistors 25 and 26 are connected to the lines 6 and 7 respectively to provide the test signal in response to the level of the terminal T. In this circuit, the voltage $V_C$ is higher than the voltage $V_E$. The reference voltages $V_1$ and $V_2$ are in the range between the voltage $V_C$ and $V_3$. Other MS-FFs in the circuit block 1 are formed in the same manner as described above. Shown at 10R and 20R are constant current sources such as resistors.

Figure 3:
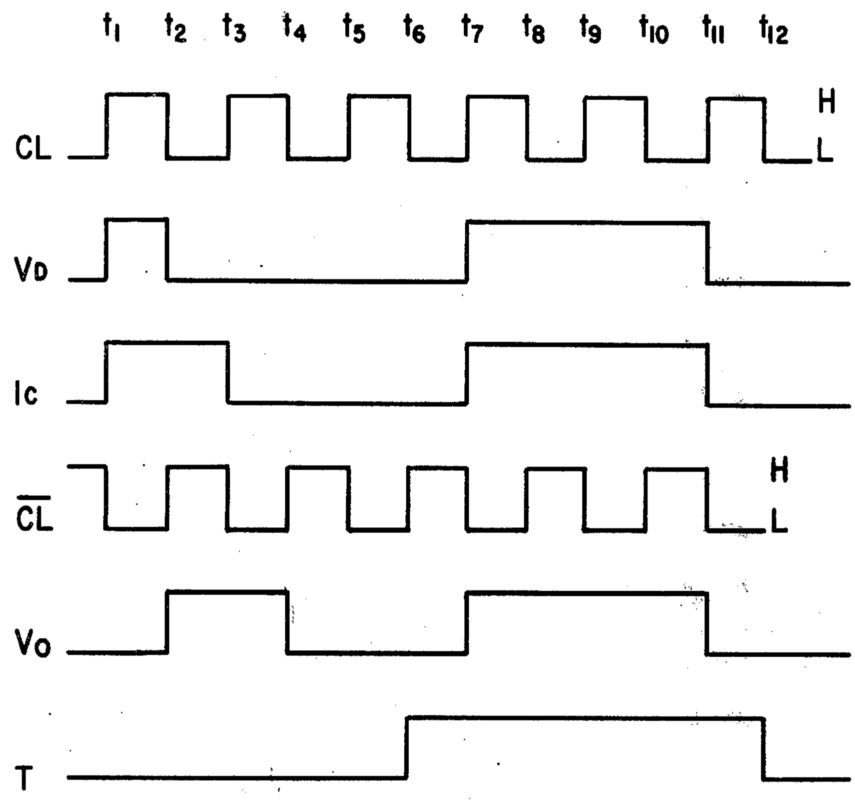
FIG. 3 is a timing diagram showing wave forms at several portions of the circuit shown in FIG. 2.

Refer now to FIG. 3, where the operation of the circuit of FIG. 2 will be described.

During the period from time $t_1$ to $t_2$, the clock signal CL is at a high level (H) to switch the transistor 15 "ON" whereby the first current switching circuit operates to write an input voltage $V_D$, of a high level, into the M-FF. At the same time clock signal $\overline{CL}$ is at a low level (L) to switch the transistor 22 on, whereby the second flip-flop circuit in the S-FF is in an enable state. Therefore, the M-FF and the S-FF are in the "gate" condition and in the "hold" condition respectively. The level of output node 2C is at a low level at this time.

During the period from time $t_2$ to $t_3$, the clock signal CL becomes low (L) to switch the transistor 16 "ON" whereby the first flip-flop circuit is placed in an enable condition to hold the level currently present at node IC. At the same time clock signal $\overline{CL}$ becomes high to switch the transistor 21 on, whereby the third current switching circuit is placed in the enable condition to read in the level of the node IC and to make the level of the voltage $V_o$ high. In the following period, from time $t_3$ to $t_4$, the high level of the voltage $V_o$ is held because the second flip-flop circuit in the S-FF is in the enable condition in response to the high level of the clock signal $\overline{CL}$. During the foregoing description the test terminal T has remained at a low level.

From the foregoing it can be seen that the level of the voltage $V_D$ i.e., the input information, is transferred to the output 2C, as the level of the voltage $V_o$, after one period of the clock signal CL, $\overline{CL}$.

In the following test period, from time $t_6$ to $t_{12}$, the level of the test terminal T is high which in turn forces lines 6 and 7 to a high level substantially equivalent to the high level of CL and $\overline{CL}$. Therefore transistors 15 and 21 are turned "ON" to drive the first and the third current switching circuits respectively. Accordingly, both the M-FF and S-FF are in the "gate" condition at the same time irrespective of the clock signals CL and $\overline{CL}$, and the MS-FF is a "data through" condition between the input and output of the circuit.

In this period, between time $t_6$ and $t_{12}$, the level of the voltage $V_D$ is high from time $t_7$ to $t_{11}$. The level of the node IC is at the same logic level as voltage $V_D$ and the level of the voltage $V_o$ is at the same logic level as voltage $V_D$. Thus, the input voltage level is directly transferred, without delay, to the output side during the test period between $t_6$ and $t_{12}$. All the MS-FFs, included in the circuit block, are commonly connected via the lines 6 and 7 to the emitters of the transistors 25 and 26 respectively, so that only two transistors are required for the test signal generating circuit.

As is apparent from the foregoing description, all the M-FFs and the S-FFs in the MS-FF circuit block may be brought to the "gate" condition in response to the test signal generating circuit, whereby the whole circuit unit may function as a single complete combined circuit. As a result, a clock signal is no longer required for circuit testing, and the pattern number of inputs required for testing is not increased. In addition, input patterns required for testing can be relatively easily obtained because of the provision of a resultant single combined circuit.

MS-FF circuit block 1 can be tested or checked separately from the combined circuit block by using usual clock signals. Thus, a complicated logic circuit unit, including two or more MS-FF circuits, can be checked in a simple manner and an accurate analyzing function can be achieved.

Description has been given by way of example illustrating CML circuits for the MS-FFs. However, even where other circuits for MS-FFs are used, the same result can be attained by providing a control circuit commensurate therewith.

In addition although a specific embodiment of this invention has been shown and described, it will be understood that various modifications may be made without departing from the spirit of this invention.

We claim:

1. A logic circuit comprising a plurality of master-slave flip-flops, said master-slave flip-flops including master flip-flops and slave flip-flops having mutually complementary clock signals applied thereto,
means for selectively producing a test signal, and
means responsive to the test signal for placing, at the same time, the master flip-flops and slave flip-flops in an enable condition.

2. A logic circuit comprising a master flip-flop and a slave flip-flop, first means responsive to a first state of a clock signal for placing the master flip-flop in a first logic state, second means responsive to a second state of the clock signal, complementary to said first state, for placing the slave flip-flop in a second logic state, and third means responsive to the application of a test signal to the logic circuit for simultaneously placing the master flip-flop and the slave flip-flop in the first logic state irrespective of the state of the clock signal.

3. The logic circuit according to claim 2, wherein said master flip-flop and said slave flip-flop include a current switching circuit for inputting logic information, a flip-flop circuit for storing said logic information and means responsive to states of said clock signal for activating said current switching circuit and said flip-flop circuit.

4. The logic circuit according to claim 3, wherein said activating means includes current switching circuit means for selectively providing a current source with one of said current switching circuit and said flip-flop circuit.

5. A logic circuit comprising a master flip-flop including first and second nodes, first and second common nodes, a first transistor having a collector coupled to said first node, a base coupled to said second node and an emitter coupled to said first common node, a second transistor having a collector coupled to said second node, a base coupled to said first node and an emitter coupled to said first common node, a third transistor having a collector coupled to said first node, a base supplied with input information and an emitter coupled to said second common node, a fourth transistor having a collector coupled to said second node, a base supplied with a reference voltage and an emitter coupled to said second common node, first current source means, a fifth transistor having a collector coupled to said second common node and an emitter coupled to said first current source means, and a sixth transistor having a collector coupled to said first common node, a base supplied with a reference voltage and an emitter coupled to said first current source means, a slave flip-flop including third and fourth nodes, third and fourth common nodes, a seventh transistor having a collector coupled to said third node, a base coupled to said fourth node, and an emitter coupled to said third common node, a eighth transistor having a collector coupled to said fourth node, a base coupled to said third node, and an emitter coupled to said third common node, a ninth transistor having a collector coupled to said third node, a base supplied with a signal derived from said second node and an emitter coupled to said fourth common node, a tenth transistor having a collector coupled to said fourth node, a base supplied with a reference voltage and an emitter coupled to said fourth common node, second current source means, an eleventh transistor having a collector coupled to said fourth common node and an emitter coupled to said second current source means, and a twelfth transistor having a collector coupled to said third common node, a base supplied with a reference voltage and an emitter coupled to said second current source means, first means responsive to a first state of a clock signal for turning on said fifth transistor, second means responsive to a second state of the clock signal complementary to said first state for turning on said eleventh transistor and third means responsive to a test signal for turning on said fifth and eleventh transistors irrespective of said clock signal.

6. The logic circuit according to claim 5, in which said third means includes first and second emitter-follower transistors for turning on said fifth and eleventh transistors respectively in response to said test signal.

* * * * *